US012592366B2

(12) United States Patent
Kim et al.

(10) Patent No.: US 12,592,366 B2
(45) Date of Patent: Mar. 31, 2026

(54) SUBSTRATE PROCESSING APPARATUS AND SUBSTRATE PROCESSING METHOD USING THE SAME

(71) Applicant: Samsung Electronics Co., Ltd., Suwon-si (KR)

(72) Inventors: Hakyoung Kim, Bucheon-si (KR); Minyoung Hur, Hwaseong-si (KR); Sumin Park, Yongin-si (KR); Daehyun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 655 days.

(21) Appl. No.: 17/951,636

(22) Filed: Sep. 23, 2022

(65) Prior Publication Data

US 2023/0282453 A1      Sep. 7, 2023

(30) Foreign Application Priority Data

Jan. 28, 2022      (KR) ........................ 10-2022-0013196

(51) Int. Cl.
  *H01J 37/32*      (2006.01)
  *H01L 21/683*      (2006.01)
(52) U.S. Cl.
  CPC .. *H01J 37/32642* (2013.01); *H01J 37/32532* (2013.01); *H01L 21/6833* (2013.01)
(58) Field of Classification Search
  CPC .......... H01J 37/32642; H01J 37/32532; H01L 21/6833
  USPC ........................................................ 118/725
  See application file for complete search history.

(56) References Cited

U.S. PATENT DOCUMENTS

| | | | |
|---|---|---|---|
| 6,344,105 B1 | 2/2002 | Daugherty et al. | |
| 7,988,814 B2 | 8/2011 | Koshiishi | |
| 8,485,128 B2 | 7/2013 | Kellogg et al. | |
| 8,896,210 B2 | 11/2014 | Nishino et al. | |
| 9,251,998 B2 | 2/2016 | Hanaoka | |
| 10,312,059 B2 | 6/2019 | Seok et al. | |
| 10,431,433 B2 | 10/2019 | Nagami et al. | |
| 11,037,766 B2 | 6/2021 | Kim et al. | |
| 2005/0263070 A1 | 12/2005 | Fink | |
| 2007/0234960 A1* | 10/2007 | Honda | .............. H01J 37/32532 156/345.47 |
| 2008/0289576 A1 | 11/2008 | Lee et al. | |

(Continued)

FOREIGN PATENT DOCUMENTS

| | | |
|---|---|---|
| JP | 2009239222 A | 10/2009 |
| JP | 2012015514 A | 1/2012 |

(Continued)

*Primary Examiner* — Charlee J. C. Bennett
(74) *Attorney, Agent, or Firm* — Muir Patent Law, PLLC

(57)      ABSTRACT

Disclosed are substrate processing apparatuses and methods. The substrate processing apparatus comprises a chuck that supports a substrate, an insulator ring that surrounds the chuck, a focus ring on the insulator ring, and a ground ring outside the insulator ring. The ground ring includes a ground ring body and an extension ring on the ground ring body. A width of the extension ring is less than that of the ground ring body. An inner lateral surface of the extension ring is more outwardly than that of the ground ring body. A difference in level between a top of the extension ring and a top surface of the chuck is in a range of about 52 mm to about 60 mm.

15 Claims, 12 Drawing Sheets

(56)         References Cited

U.S. PATENT DOCUMENTS

| | | | |
|---|---|---|---|
| 2009/0242127 A1 | 10/2009 | Koshimizu et al. | |
| 2012/0003836 A1* | 1/2012 | Kellogg | H01L 21/68785 |
| | | | 118/723 R |
| 2012/0160418 A1* | 6/2012 | Hanaoka | H01J 37/32568 |
| | | | 156/345.38 |
| 2015/0027635 A1* | 1/2015 | Hanaoka | H01J 37/32027 |
| | | | 118/723 E |
| 2015/0325413 A1 | 11/2015 | Kim et al. | |
| 2019/0348262 A1* | 11/2019 | Hayasaka | H01L 21/67126 |
| 2020/0152427 A1 | 5/2020 | Lee et al. | |
| 2020/0194231 A1 | 6/2020 | Chen et al. | |
| 2020/0365378 A1* | 11/2020 | Kellogg | H01J 37/32715 |
| 2022/0037121 A1* | 2/2022 | Dorf | H01L 21/31116 |

FOREIGN PATENT DOCUMENTS

| | | | |
|---|---|---|---|
| KR | 100743872 B1 | 7/2007 | |
| KR | 100855002 B1 | 8/2008 | |
| KR | 1020100114187 A | 10/2010 | |
| KR | 1020150129942 A | 11/2015 | |
| KR | 1020180136390 A | 12/2018 | |
| KR | 1020200055583 A | 5/2020 | |
| KR | 1020200075768 A | 6/2020 | |

* cited by examiner

ST

FR

ER

23(2)

9(EC)

D1

D2

D3

SUBSTRATE PROCESSING APPARATUS AND SUBSTRATE PROCESSING METHOD USING THE SAME

CROSS-REFERENCE TO RELATED APPLICATION

This U.S. nonprovisional application claims priority under 35 U.S.C § 119 to Korean Patent Application No. 10-2022-0013196 filed on Jan. 28, 2022 in the Korean Intellectual Property Office, the disclosure of which is hereby incorporated by reference in its entirety.

BACKGROUND

The present inventive concepts relate to a substrate processing apparatus and a substrate processing method, and more particularly, a substrate processing apparatus capable of controlling plasma on an edge region and a substrate processing method using the same.

A semiconductor device may be fabricated through various processes. For example, the semiconductor device may be manufactured by a photolithography process, an etching process, and a deposition process performed on a silicon wafer. Various fluids may be used in such processes. For example, plasma may be used in an etching process and/or a deposition process. It may be required to control a position of plasma during processes. A focus ring may be utilized to control the position of plasma.

SUMMARY

Some embodiments of the present inventive concepts provide a substrate processing apparatus capable of controlling plasma on an edge region and a substrate processing method using the same.

Some embodiments of the present inventive concepts provide a substrate processing apparatus capable of reducing leakage of radio-frequency (RF) power applied to a chuck and a substrate processing method using the same.

Some embodiment of the present inventive concepts provide a substrate processing apparatus capable of reducing leakage of direct-current (DC) power applied to a focus ring and a substrate processing method using the same.

The object of the present inventive concepts is not limited to the ones mentioned above, and other objects which have not been mentioned above will be clearly understood to those skilled in the art from the following description.

According to some embodiments of the present inventive concepts, a substrate processing apparatus may comprise: a chuck configured to support a substrate; an insulator ring that surrounds the chuck; a focus ring on the insulator ring; and a ground ring outside the insulator ring. The ground ring may include: a ground ring body; and an extension ring on the ground ring body. A width of the extension ring in a horizontal and radial direction may be less than a width of the ground ring body in the horizontal and radial direction. An inner lateral surface of the extension ring may be positioned farther than an inner lateral surface of the ground ring body from a center point of the ground ring. A top surface of the extension ring is positioned lower than a top surface of the chuck by a vertical distance in a range of about 52 mm to about 60 mm.

According to some embodiments of the present inventive concepts, a substrate processing apparatus may comprise: a chuck that has a plasma electrode; an insulator ring that surrounds the chuck; a focus ring on the insulator ring; a ground ring outside the insulator ring; a power delivery conductor line below the focus ring; a first power source configured to supply a first power to the plasma electrode; and a second power source configured to supply a second power to the power delivery conductor line. The power delivery conductor line may include: a first conductive line that vertically extends in the insulator ring; and a second conductive line connected to a bottom end of the first conductive line. The second conductive line may inwardly extend in a horizontal direction from the bottom end of the first conductive line. A level of a top surface of the ground ring is lower than a level of a bottom surface of the second conductive line.

According to some embodiments of the present inventive concepts, a substrate processing method may comprise: placing a substrate into a substrate processing apparatus; supplying the substrate processing apparatus with a process gas; and applying a first power to a chuck of the substrate processing apparatus. The step of applying the first power to the chuck may include: applying the first power to a plasma electrode of the chuck; allowing a portion of the first power applied to the plasma electrode to transfer to a focus ring that surrounds the chuck; and allowing another portion of the first power applied to the plasma electrode to transfer to a ground ring below the focus ring. A top surface of the ground ring is lower than a top surface of the chuck by a vertical distance in a range of about 52 mm to about 60 mm.

Details of other example embodiments are included in the description below and drawings.

DETAILED DESCRIPTION OF EMBODIMENTS

Figure 1:
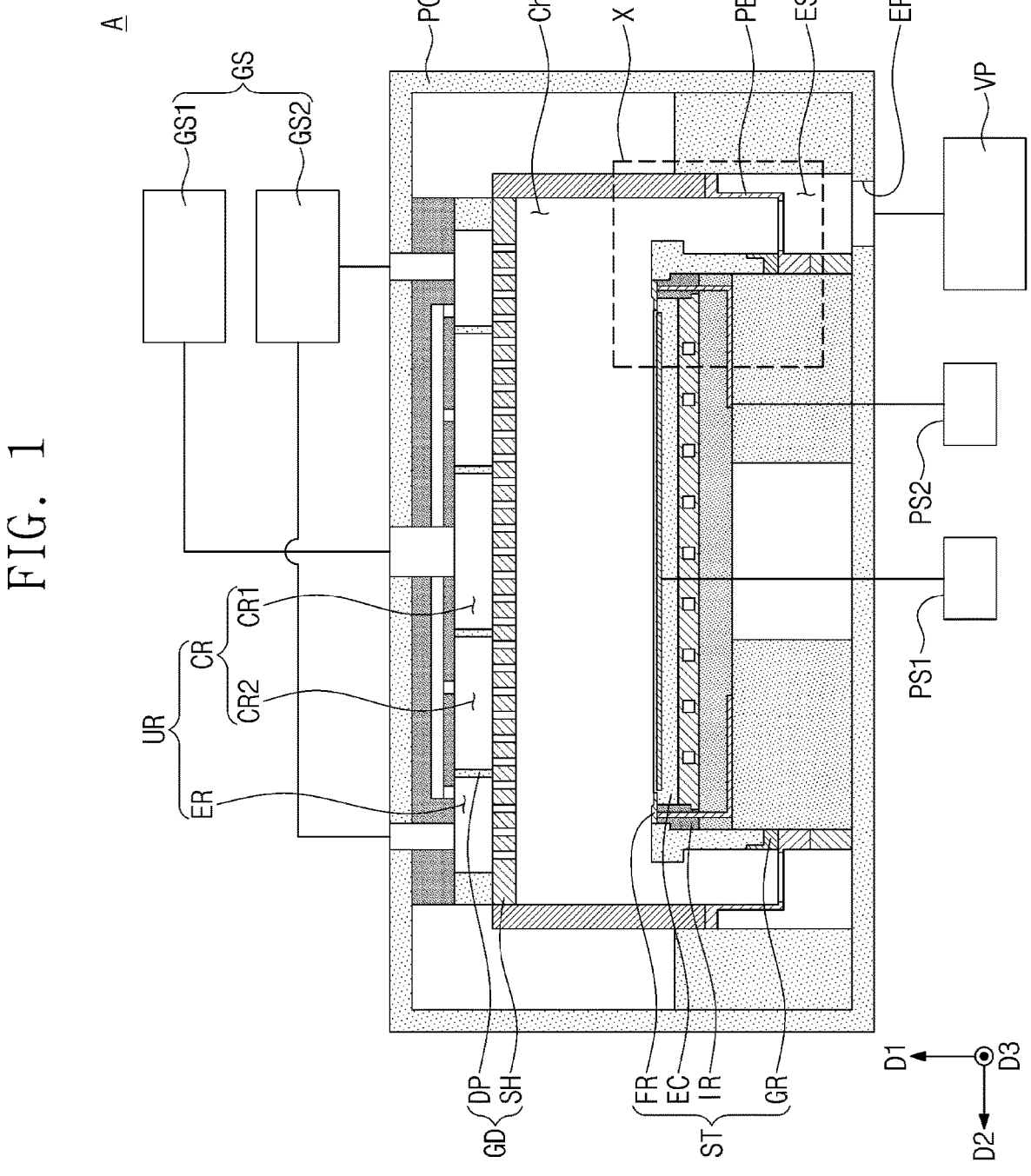
FIG. 1 illustrates a cross-sectional view showing a substrate processing apparatus according to some embodiments of the present inventive concepts.

The following will now describe some embodiments of the present inventive concepts with reference to the accompanying drawings. Like reference numerals may indicate like components throughout the description.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration. The language of the claims should be referenced in determining the requirements of the invention.

FIG. 1 illustrates a cross-sectional view showing a substrate processing apparatus according to some embodiments of the present inventive concepts.

In this description, symbol D1 may indicate a first direction, symbol D2 may indicate a second direction that intersects the first direction D1, and symbol D3 may indicate a third direction that intersects each of the first and second directions D1 and D2. The first direction D1 may be called a vertical direction. Each of the second and third directions D2 and D3 may be called a horizontal direction. For example, the first, second, and third directions D1, D2 and D3 may be perpendicular to each other.

Referring to FIG. 1, a substrate processing apparatus A may be provided. The substrate processing apparatus A may be a device that uses plasma to process a substrate. The substrate may include or may be a silicon wafer, but the present inventive concepts are not limited thereto. The substrate processing apparatus A may be configured such that the plasma is used to perform an etching process and/or a deposition process on the substrate. For example, the substrate processing apparatus A may perform a Bosch process in which the plasma is used to repeatedly execute etching and deposition processes on the substrate. For example, etching processes and deposition processes may be alternately and repeatedly performed in the substrate processing apparatus A on a substrate or on multiple substrates together or sequentially.

The substrate processing apparatus A may use various ways to generate the plasma. For example, the substrate processing apparatus A may generate the plasma by using a capacitively coupled plasma (CCP) mode, an inductively coupled plasma (ICP) mode, or a magnetically enhanced reactive ion etching (MERIE) mode. The present inventive concepts, however, are not limited thereto, and the substrate processing apparatus A may use other ways to generate the plasma so as to perform a process on the substrate. For convenience, the following will describe the substrate processing apparatus A operated in the capacitively coupled plasma (CCP) mode.

The substrate processing apparatus A may include a process chamber PC, a gas supply unit GS, a gas distribution unit GD, a stage ST, a plasma baffle PB, a vacuum pump VP, a first power source PS1, and a second power source PS2.

The process chamber PC may provide a process space Ch. The process chamber PC may be connected to the gas supply unit GS to receive a process gas from the gas supply unit GS. The process chamber PC may be connected to the vacuum pump VP. A fluid, such as a process gas, in the process space Ch may be discharged toward the vacuum pump VP. The process chamber PC may provide an exhaust port EP. The process space Ch may be connected through the exhaust port EP to the vacuum pump VP. The exhaust port EP may be positioned biased towards one side in the process chamber PC. For example, the exhaust port EP may be positioned between the center of the process chamber PC and a side wall of the process chamber PC, e.g., in a plan view. For example, the exhaust port EP may be positioned biased towards a right-side based on FIG. 1. The stage ST and the plasma baffle PB may be disposed in the process chamber PC.

The gas supply unit GS may supply a process gas into the process space Ch. The gas supply unit GS may include a gas tank, a compressor, a pipe line, a controller, and so forth. The gas supply unit GS may supply many/various kinds of gases to the process chamber PC, e.g., at a time or sequentially. In certain embodiments, the gas supply unit GS may supply different gases to the process chamber PC at different times depending on a process performed in the process chamber PC. The gas supply unit GS may include a first gas supply unit GS1 and a second gas supply unit GS2.

The first gas supply unit GS1 may supply a first process gas. The process space Ch may be supplied and completely filled with the first process gas. For example, the first process gas may spread relatively uniformly throughout the process space Ch. For example, a density of the first process gas in an outermost area of the process space Ch, e.g., in a plan view, may be within a range ±20% of a density of the first process gas in a center of the process space Ch while the first process gas is provided in the process space Ch. The second gas supply unit GS2 may supply a second process gas. The second process gas may include a gas whose kind is distinguished from that of the first process gas. For example, the second process gas may be a different gas from the first process gas. The second process gas may be supplied to be biased towards one side in the process space Ch. For example, the second process gas may be concentrated in a certain area of the process space Ch. For example, a difference between a density of the second process gas in the concentrated area and a density of the second process gas in an unconcentrated area of the process space Ch may be more than 30% of the density of the second process gas in the concentrated area. In certain process condition, a density of the second process gas in the concentrated area may be two times or more of a density of the second process gas in an unconcentrated area of the process space Ch. For example, the substrate processing apparatus A may be controlled for the first process gas to spread uniformly throughout the process space Ch and for the second process gas to be concentrated in certain area of the process space Ch.

The gas distribution unit GD may be positioned in the process chamber PC. The gas distribution unit GD may distribute a process gas over the process space Ch. The gas distribution unit GD may include a showerhead SH and a gas separation plate DP. The showerhead SH may provide a plurality of gas supply holes. The showerhead SH may serve as an upper electrode. The showerhead SH may separate the process space Ch from a distribution space UR which is a space above the showerhead SH. For example, the showerhead SH may be positioned/interposed between the process space Ch and the distribution space UR. The distribution space UR may be divided into a central region CR and an edge region ER. For example, the gas separation plate DP may divide the central region CR and the edge region ER from each other. For example, a gas separation plate DP may be positioned/interposed between the central region CR and the edge region ER. The central region CR may be divided into a first central region CR1 and a second central region CR2. For example, another gas separation plate DP may be positioned/interposed between the first central region CR1 and the second central region CR2.

The first process gas may be supplied to all of the first central region CR1, the second central region CR2, and the edge region ER. The second process gas may be supplied to only the edge region ER. A process gas supplied into the distribution space UR may move to the process space Ch after being distributed through the gas supply holes of the showerhead SH.

The stage ST may support a substrate. The stage ST may be positioned in the process chamber PC. The stage ST may include a chuck EC, a focus ring FR, a insulator ring IR, and a ground ring GR. The stage ST will be further discussed in detail below.

The plasma baffle PB may surround the stage ST. For example, below the chuck EC, the plasma baffle PB may surround the stage ST. For example, the plasma baffle PB may surround the stage ST and may laterally overlap a lower portion of the stage ST than the chuck EC is placed. For example, the plasma baffle PB may not laterally overlap the chuck EC. The plasma baffle PB may be designed to control/manage a flow rate of the plasma and/or a pressure in the process space Ch. The present inventive concepts, however, are not limited thereto, and at a height similar to that of the focus ring FR, the plasma baffle PB may surround the stage ST in certain embodiments. Alternatively, the plasma baffle PB may be located at a position higher than that of the focus ring FR. A space under the plasma baffle PB may be an exhaust space ES. The exhaust space ES may be connected to the exhaust port EP. The plasma baffle PB may allow a gas to pass from the process space Ch to the exhaust space ES. For example, a gas in the process space Ch may pass through the plasma baffle PB to the exhaust space ES, thereby being discharged from/through the exhaust port EP.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The plasma may not be allowed to easily pass through the plasma baffle PB. For example, the plasma baffle PB may be designed/configured such that the plasma flows through the plasma baffle PB in a proper speed/rate for a plasma process to be properly performed in the process space Ch. For example, the plasma baffle PB may limit/control a position of the plasma. The plasma baffle PB may allow the plasma to concentrate on a substrate disposed on the stage ST. Therefore, the plasma baffle PB may be a confinement ring. The plasma baffle PB may be fixed/attached to the stage ST and/or the process chamber PC. For example, the plasma baffle PB may be fixed/attached to the process chamber PC through/with a bolt (not shown) or the like.

The vacuum pump VP may be connected to the process chamber PC. For example, the vacuum pump VP may be connected through the exhaust port EP to the process space Ch. The vacuum pump VP may draw a fluid from the process space Ch. The vacuum pump VP may be positioned on one side below the process chamber PC. For example, the vacuum pump VP may vertically overlap the process chamber PC. The present inventive concepts, however, are not limited thereto, and the vacuum pump VP may be positioned on a lateral side of the process chamber PC. For example, the vacuum pump VP may be laterally overlap the process chamber PC.

The first power source PS1 may be electrically connected to the chuck EC. The first power source PS1 may apply a first power to the chuck EC. For example, the first power source PS1 may apply a radio-frequency (RF) power to the chuck EC. The first power source PS1 may include components that generate the RF power and transfer the RF power to the chuck EC. The first power source PS1 will be further discussed in detail below.

The second power source PS2 may be electrically connected to the focus ring FR. The second power source PS2 may apply a second power to the focus ring FR. The second power may be distinguished/different from the first power. For example, the second power may be a direct-current (DC) power. The second power source PS2 may include components that generate the DC power and transfer the DC power to the focus ring FR. The present inventive concepts, however, are not limited thereto, and the second power may also be an RF power. The second power source PS2 will be further discussed in detail below.

Figure 2A:
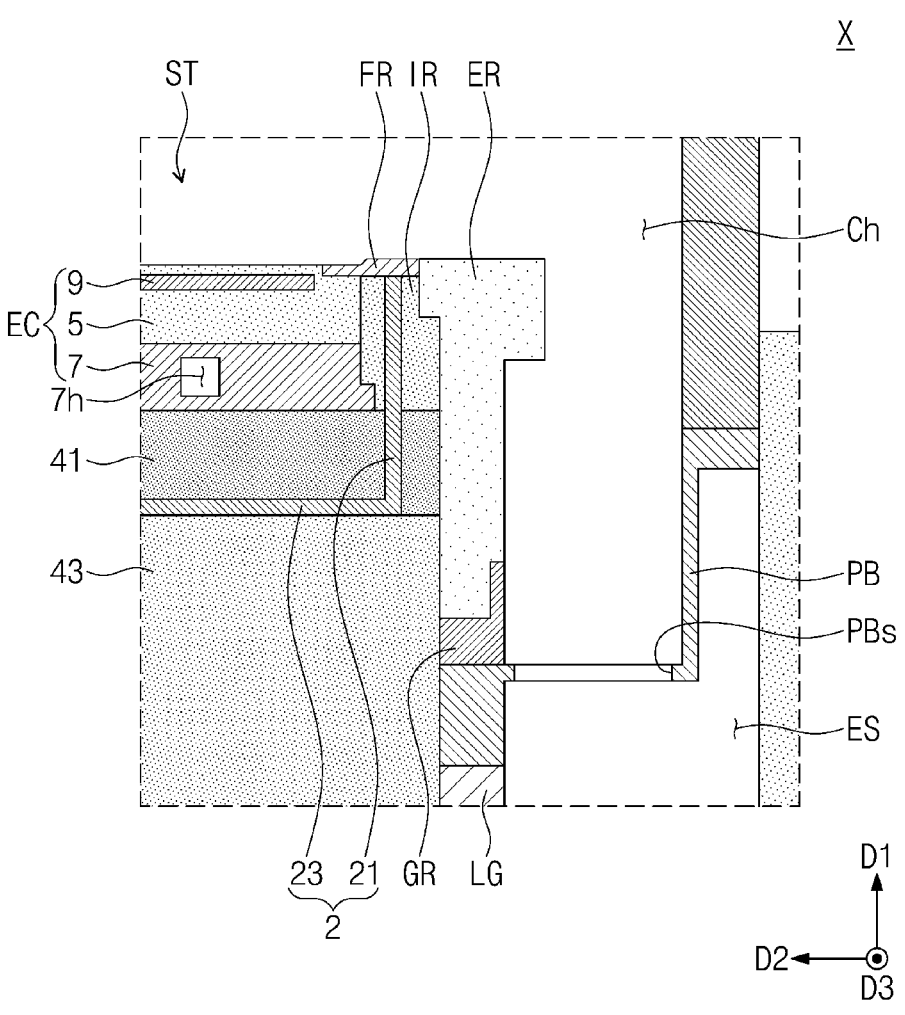
FIGS. 2A and 2B illustrate enlarged cross-sectional views showing section X of FIG. 1.
Figure 2B:
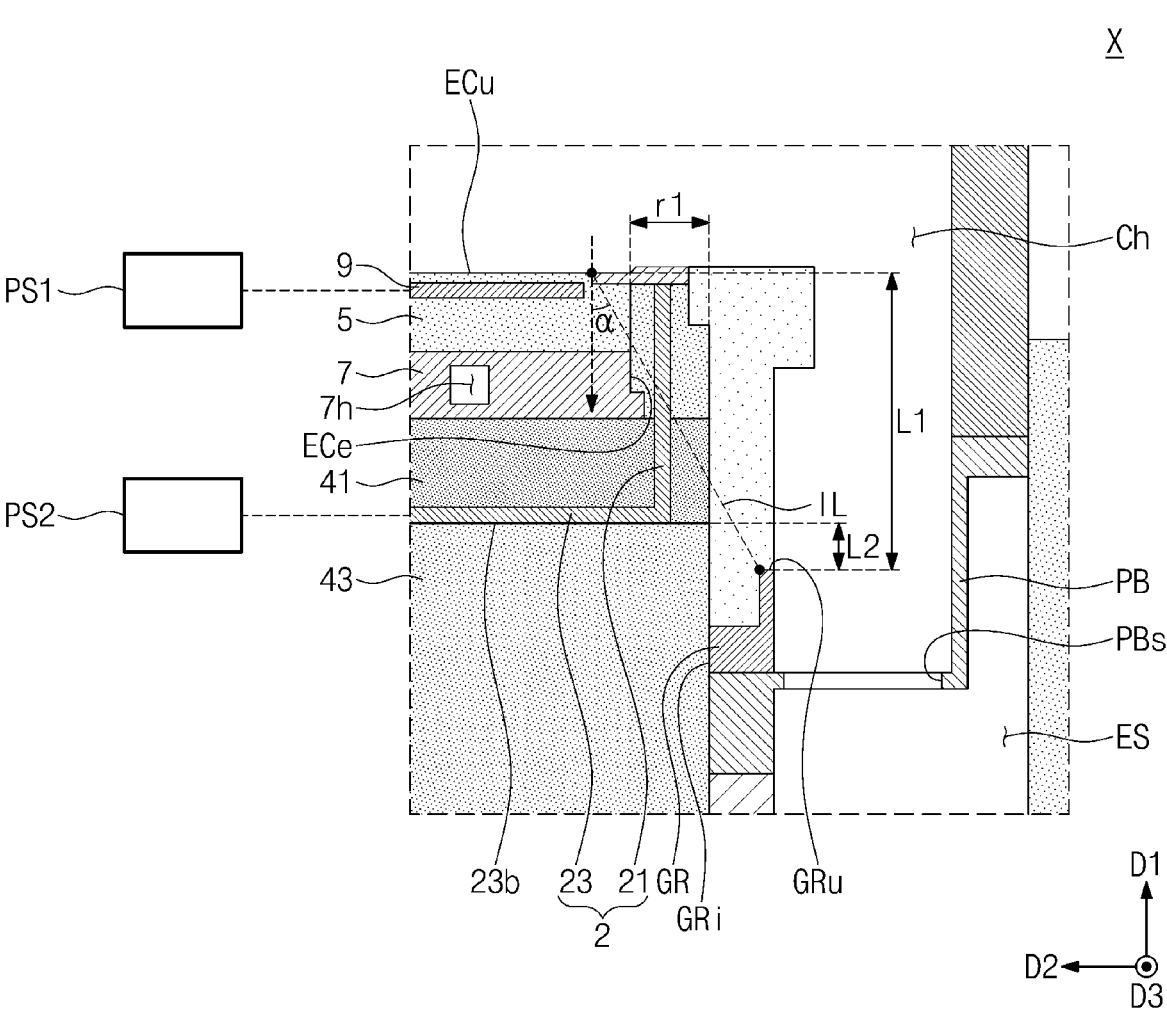
Figure 3:
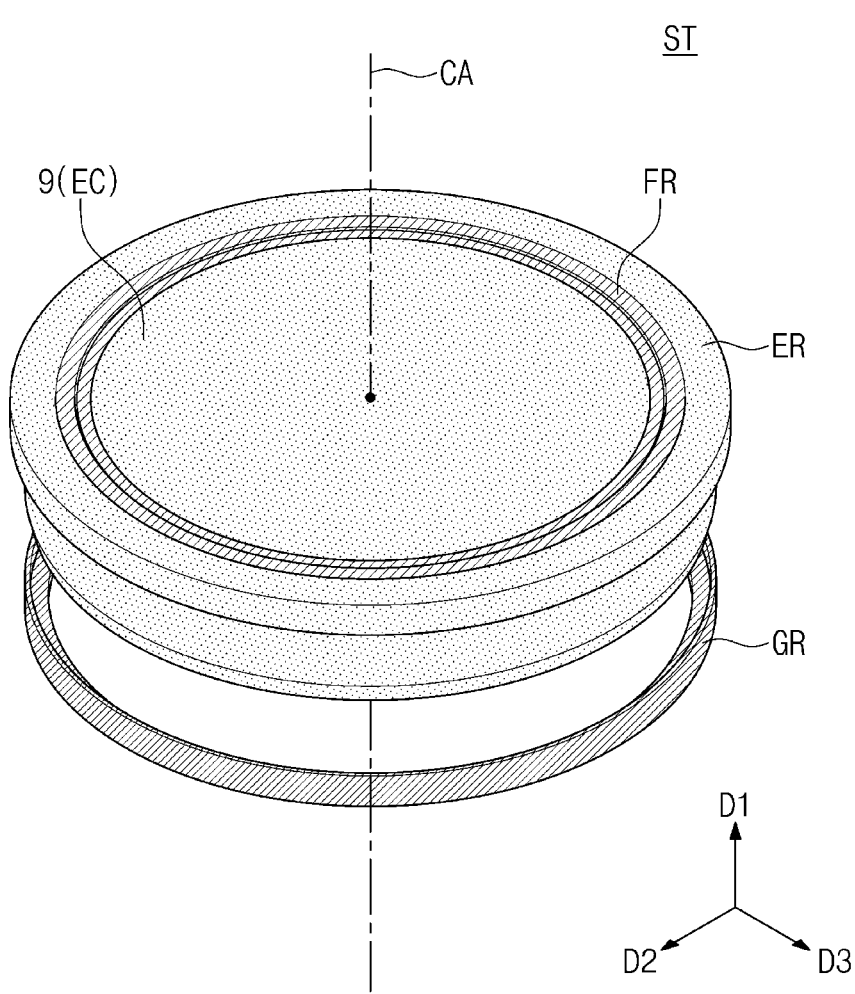
FIG. 3 illustrates a perspective view showing a stage positioned in a substrate processing apparatus according to some embodiments of the present inventive concepts.
Figure 4:
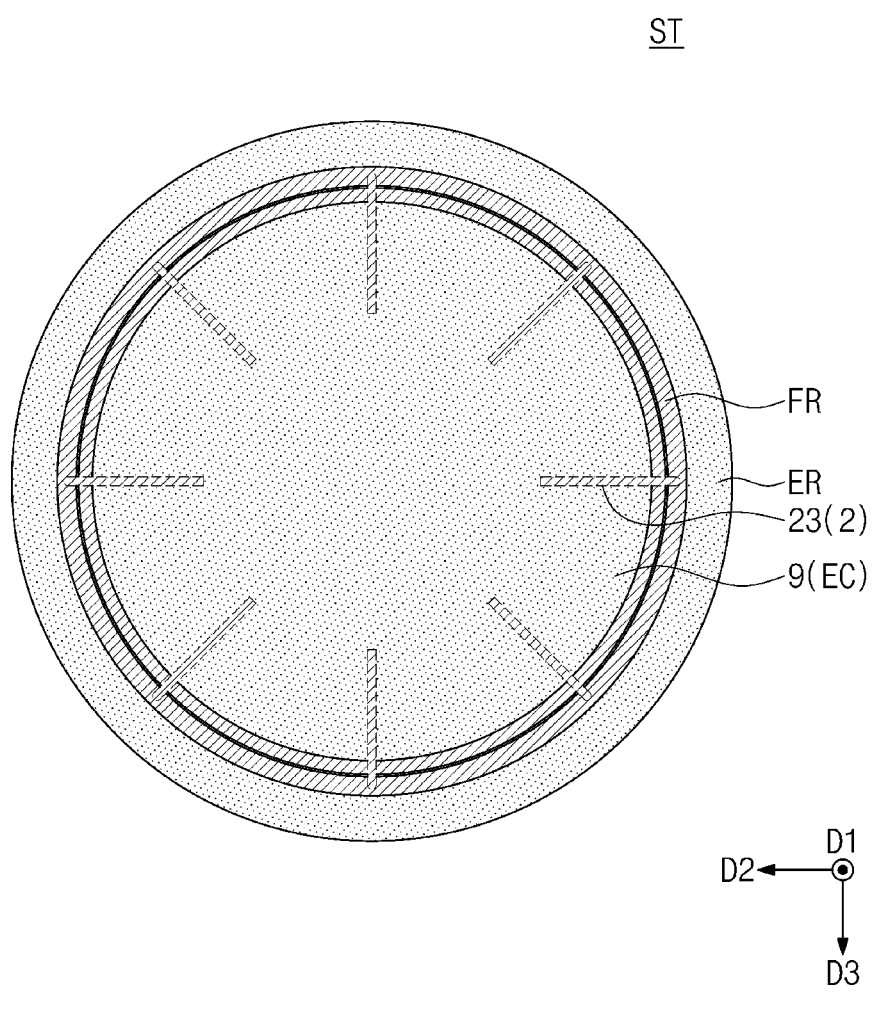
FIG. 4 illustrates a plan view showing a stage placed in a substrate processing apparatus according to some embodiments of the present inventive concepts.

FIGS. 2A and 2B illustrate enlarged cross-sectional views showing section X of FIG. 1. FIG. 3 illustrates a perspective view showing a stage positioned in a substrate processing apparatus according to some embodiments of the present inventive concepts. FIG. 4 illustrates a plan view showing a stage placed/attached in a substrate processing apparatus according to some embodiments of the present inventive concepts.

Referring to FIGS. 2A and 3, the stage ST may include a chuck EC, a insulator plate 41, a lower insulator plate 43, a focus ring FR, a insulator ring IR, a cover ring ER, a power delivery member 2, a ground ring GR, and a lower ground member LG.

The chuck EC may support a substrate. The chuck EC may use an electrostatic force to rigidly place a substrate in a specific position of the chuck EC, e.g., on an upper surface of the chuck EC. The chuck EC may be, for example, an electrostatic chuck (ESC). The chuck EC may include a puck 5, a plasma electrode 9, a cooling plate 7, and a chuck electrode.

The puck 5 may support a substrate. The puck 5 may be provided on its top surface with burl structure for supporting a substrate. The puck 5 may include ceramic. For example, a part of the puck 5 may be formed of ceramic, but the present inventive concepts are not limited thereto. In addition, the puck 5 may include a heater therein.

The plasma electrode 9 may be positioned in the puck 5. The plasma electrode 9 may be electrically connected to the first power source (see PS1 of FIG. 1). The first power, which the first power source PS1 applies to the plasma electrode 9, may generate an electric field in the process space Ch. The plasma electrode 9 may include or be formed of a conductive material. For example, the plasma electrode 9 may be an electrode to which an electric power for generating a plasma is applied. For example, the first power may generate a plasma in the process space Ch with the first process gas and/or the second process gas.

The cooling plate 7 may be positioned below the puck 5. The cooling plate 7 may include a material with high thermal conductivity. For example, the cooling plate 7 may include aluminum (Al). The cooling plate 7 may provide a cooling passage $7h$. The cooling passage $7h$ may allow a cooling water to flow through while adsorbing heat.

The chuck electrode may be positioned in the puck 5. The chuck electrode may cause a substrate to adhere to a top surface of the puck 5. For example, the chuck electrode may provide an electrostatic force between the top surface of the puck 5 and the substrate such that the substrate adheres to the top surface of the puck 5 with the electrostatic force.

The insulator plate 41 may be positioned below the chuck EC. The insulator plate 41 may include or be formed of a dielectric material, such as ceramic. A portion of the power delivery member 2 may be positioned in the insulator plate 41. A detailed description thereof will be further discussed below.

The lower insulator plate 43 may be located below the insulator plate 41. The lower insulator plate 43 may include or be formed of a dielectric material, such as ceramic.

The focus ring FR may surround the chuck EC. For example, when viewed in plan, the focus ring FR may surround a substrate disposed on the chuck EC. The focus ring FR may be located on the insulator ring IR. The focus ring FR may be electrically connected to the second power source (see PS2 of FIG. 1). The second power, which the second power source PS2 applies to the focus ring FR, may generate an electric field in the process space Ch. The focus ring FR may include or be formed of silicon (Si) and/or silicon carbide (SiC).

The insulator ring IR may surround the chuck EC. The insulator ring IR may be disposed below the focus ring FR. The insulator ring IR may include or be formed of a dielectric material. A portion of the power delivery member 2 may be positioned in the insulator ring TR. A detailed description thereof will be further discussed below.

The cover ring ER may surround the focus ring FR and/or the insulator ring IR. The cover ring ER may have a bottom surface in contact with the ground ring GR. The cover ring ER may have an outer lateral surface a portion of which is in contact with the ground ring GR. The cover ring ER may include or be formed of a dielectric material, such as quartz.

The power delivery member 2 may be positioned below the focus ring FR. For example, the power delivery member 2 may be in contact with one surface, e.g., a bottom surface, of the focus ring FR. The power delivery member 2 may electrically connect the focus ring FR to the second power source (see PS2 of FIG. 1). The second power, which the second power source PS2 supplies, may be transmitted through the power delivery member 2 to the focus ring FR. The power delivery member 2 may include a first conductive member 21 and a second conductive member 23. For example, the power delivery member 2 may be a power delivery conductor line or a power delivery conductor bar. For example, the first conductive member 21 may be a conductive line or bar, and the second conductive member 23 may be a conductive line or bar.

The first conductive member 21 may extend vertically. The first conductive member 21 may be positioned in the insulator ring IR. In some embodiments, a top surface of the first conductive member 21 may be in contact with a bottom surface of the focus ring FR. The first conductive member 21 may include or be formed of a conductive material, such as copper (Cu). For example, the focus ring FR may fully overlap the first conductive member 21 in the vertical direction.

The second conductive member 23 may be directly connected to a bottom of the first conductive member 21. The second conductive member 23 may extend horizontally. In an embodiment, the second conductive member 23 may extend in a horizontal direction inwardly receding from a bottom end of the first conductive member 21. For example, the second conductive member 23 may extend from the bottom end of the first conductive member 21 toward a central axis (see CA of FIG. 3) of the stage ST. The second conductive member 23 may be positioned inside the insulator plate 41. A bottom surface of the second conductive member 23 and a bottom surface of the insulator plate 41 may be positioned on the same plane. For example, the bottom surface of the second conductive member 23 and the bottom surface of the insulator plate 41 may be at the same vertical level, but the present inventive concepts are not limited thereto. The second conductive member 23 may include or be formed of a conductive material, such as copper (Cu). The second conductive member 23 may be electrically connected to the second power source PS2. For example, another conductive member (not shown) may be electrically/directly connected to one side/end of the second conductive member 23 to thereby electrically connect the second conductive member 23 to the second power source PS2.

Referring to FIG. 4, a plurality of power delivery members 2 may be provided in the stage ST, e.g., in the insulator ring IR and the insulator plate 41. For example, eight power delivery members 2 may be provided. The plurality of power delivery members 2 may be disposed spaced apart from each other in a circumferential direction. A single power delivery member 2 will be discussed below in the interest of convenience.

Referring back to FIGS. 2A and 3, the ground ring GR may be positioned outside the insulator ring IR, e.g., in a plan view. For example, when viewed in plan, the ground ring GR may surround the chuck EC and the insulator ring TR. The ground ring GR may be positioned below the cover ring ER. For example, the ground ring GR may not overlap the insulator ring IR in a horizontal direction. The ground ring GR may surround the lower insulator plate 43. For example, an inner lateral surface of the ground ring GR may be in contact with an outer lateral surface of the lower insulator plate 43.

The ground ring GR may include or be formed of a conductive material, such as aluminum (Al). The ground ring GR may be electrically grounded. For example, the ground ring GR may be electrically grounded/connected to the lower ground member LG. For example, the ground ring GR may be electrically grounded/connected through the plasma baffle PB to the lower ground member LG.

The lower ground member LG may be electrically grounded/connected to the process chamber (see PC of FIG. 1). The lower ground member LG may include or be formed of a conductive material such as that of the ground ring GR. For example, the lower ground member LG and the ground ring GR may be formed of the same conductive material.

The plasma baffle PB may provide a slit PBs. The process space Ch may be spatially connected through the slit PBs to the exhaust space ES.

Referring to FIG. 2B, a top surface GRu of the ground ring GR may be positioned below a top surface ECu of the chuck (see EC of FIG. 2A). A first difference L1 may be defined to indicate a difference in level between the top surface GRu of the ground ring GR and the top surface ECu of the chuck EC. For example, the top surface ECu of the chuck EC may be higher than the top surface GRu of the ground ring GR by the length L1 in a vertical direction. The first difference L1 may range from about 52 mm to about 60 mm. For example, the first difference L1 may be about 56 mm.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

An inner lateral surface GRi of the ground ring GR may be positioned more outwardly than an outer lateral surface ECe of the chuck EC, e.g., with respect to a center point of the stage ST in a plan view. For example, the inner lateral surface GRi of the ground ring GR may be outwardly spaced apart by a first radial distance r1 from the outer lateral surface ECe of the chuck EC. For example, the chuck EC and the ground ring GR may not vertically overlap each other. The first radial distance r1 may range from about 30 mm to about 38 mm. For example, the first radius r1 may be about 34 mm.

A minimum line IL may be defined between the top surface GRu of the ground ring GR and the top surface ECu of the chuck EC. For example, the minimum line IL may correspond to a minimum distance (e.g., the closest distance) between the top surface GRu of the ground ring GR and the top surface ECu of the chuck EC. For example, the minimum line IL may be a line connecting the closest points between the top surface GRu of the ground ring GR and the top surface ECu of the chuck EC. The minimum line IL may extend obliquely. For example, an acute angle may be made between the minimum line TL and a vertical direction (e.g., a vertical line). For example, an angle α of about 200 to about 450 may be provided between the minimum line IL and a vertical direction. For example, an angle α of about 200 to about 450 may be provided between the minimum line IL and a vertical direction.

The top surface GRu of the ground ring GR may be located at a level lower than that of a bottom surface of the chuck EC. For example, the top surface GRu of the ground ring GR may be positioned lower than a bottom surface of the cooling plate 7. For example, the ground ring GR may not horizontally overlap the chuck EC and/or the cooling plate 7.

The ground ring GR may be positioned lower than the second conductive member 23. For example, the top surface GRu of the ground ring GR may be positioned lower than a bottom surface 23b of the second conductive member 23. In this case, the top surface GRu of the ground ring GR may be located at a level lower than that of the bottom surface 23b of the second conductive member 23. A second difference L2 may be defined to indicate a difference in level (e.g., vertical level) between the top surface GRu of the ground ring GR and the bottom surface 23b of the second conductive member 23. For example, the second difference L2 may be a vertical distance. For example, the top surface GRu of the ground ring GR may be lower than the bottom surface 23b of the second conductive member 23 by the distance L2 in the vertical direction. The second difference L2 may range from about 1 mm to about 50 mm. For example, the second difference L2 may be about 15 mm. The present inventive concepts, however, are not limited to the values mentioned above, and the second difference L2 may be changed depending on detailed designs.

Figure 5:
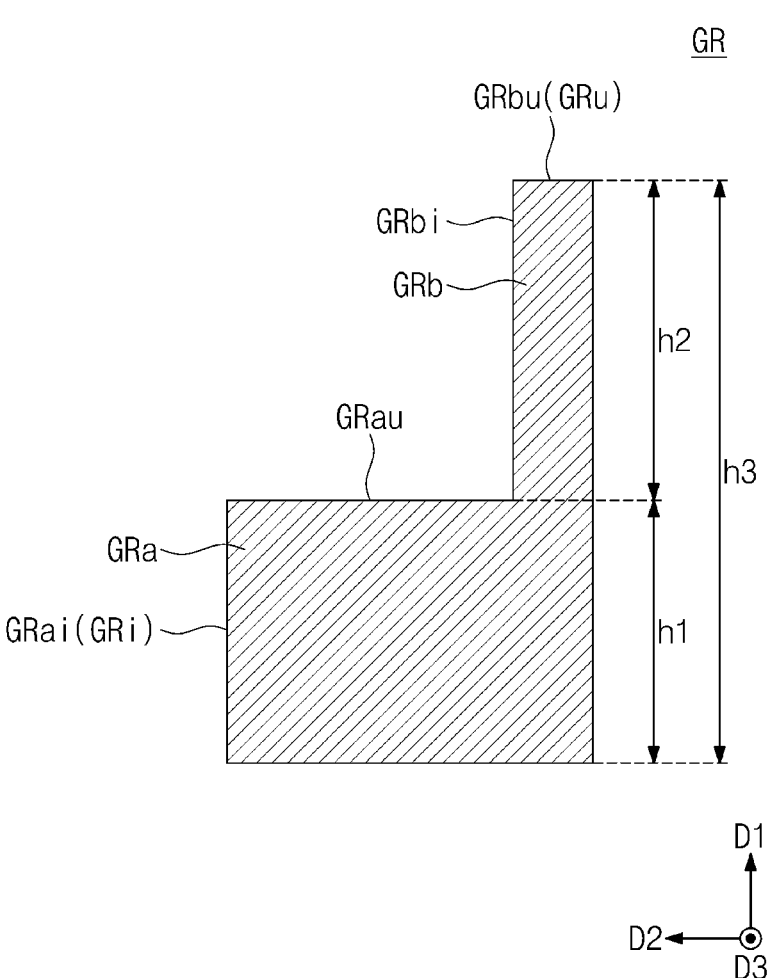
FIG. 5 illustrates a cross-sectional view showing a ground ring included in a substrate processing apparatus according to some embodiments of the present inventive concepts.

FIG. 5 illustrates a cross-sectional view showing a ground ring in a substrate processing apparatus according to some embodiments of the present inventive concepts.

Referring to FIG. 5, the ground ring GR may include and/or be formed of a ground ring body GRa and an extension ring GRb.

A first height h1 may be defined as a height of the ground ring body GRa. For example, the ground ring body GRa may have the first height h1. The first height h1 may be in a range from about 5 mm to about 15 mm. For example, the first height h1 may be about 10 mm. A top surface GRau of the ground ring body GRa may be located lower than the extension ring GRb. An inner lateral surface GRai of the ground ring body GRa may be the inner lateral surface GRi of the ground ring GR discussed with reference to FIG. 2B.

The extension ring GRb may be positioned on the ground ring body GRa. For example, the extension ring GRb may be coupled to the top surface GRau of the ground ring body GRa. In this case, a top surface GRbu of the extension ring GRb may be the top surface GRu of the ground ring GR discussed with reference to FIG. 2B. A second height h2 may be defined as a height of the extension ring GRb. For example, the extension ring GRb may have the second height h2. The second height h2 may be in a range from about 11 mm to about 31 mm. For example, the second height h2 may be about 21 mm.

A width in a horizontal direction of the extension ring GRb may be less than a width in a horizontal direction of the ground ring body GRa. For example, the widths of the extension ring GRb and the ground ring body GRa may be widths in a radial direction. For example, widths of rings may be radial distances between inner side surfaces and outer side surfaces of the rings respectively. An inner lateral surface GRbi of the extension ring GRb may be positioned more outwardly than the inner lateral surface GRai of the ground ring body GRa. For example, a horizontal/radial distance from the central axis CA of the stage ST to the inner lateral surface GRbi of the extension ring GRb may be greater than a horizontal/radial distance from the central axis CA of the stage ST to the inner lateral surface GRai of the ground ring body GRa. An outer lateral surface of the extension ring GRb may be positioned on the same curved surface on which an outer lateral surface of the ground ring body GRa is positioned. For example, the outer lateral surface of the extension ring GRb may be vertically fully overlap the outer lateral surface of the ground ring body GRa.

A third height h3 may be defined as a total height of the ground ring GR. For example, the ground ring GR may have the third height h3. The third height h3 may be in a range from about 5 mm to about 48 mm. For example, the third height h3 may be in a range from about 29 mm to about 33 mm.

Figure 6:
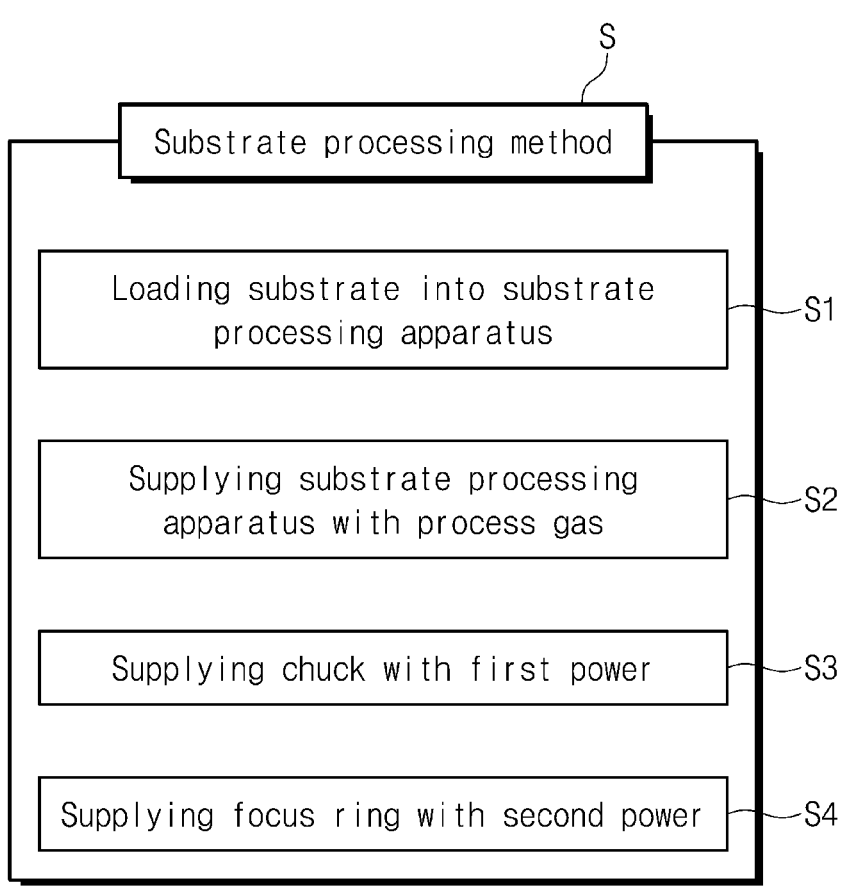
FIG. 6 illustrates a flow chart showing a substrate processing method according to some embodiments of the present inventive concepts.

FIG. 6 illustrates a flow chart showing a substrate processing method according to some embodiments of the present inventive concepts.

Referring to FIG. 6, a substrate processing method S may be provided. The substrate processing method S may be a method in which the substrate processing apparatus A discussed with reference to FIGS. 1 to 5 is used to execute a process on a substrate. The substrate processing method S may include a step S1 of loading a substrate into a substrate processing apparatus, a step S2 of supplying the substrate processing apparatus with a process gas, a step S3 of supplying a chuck with a first power, and a step S4 of supplying a focus ring with a second power.

With reference to FIGS. 7 to 11, the following will describe in detail the substrate processing method S of FIG. 6.

FIGS. 7 to 11 illustrate cross-sectional views showing a substrate processing method according to the flow chart of FIG. 6.

Figure 7:
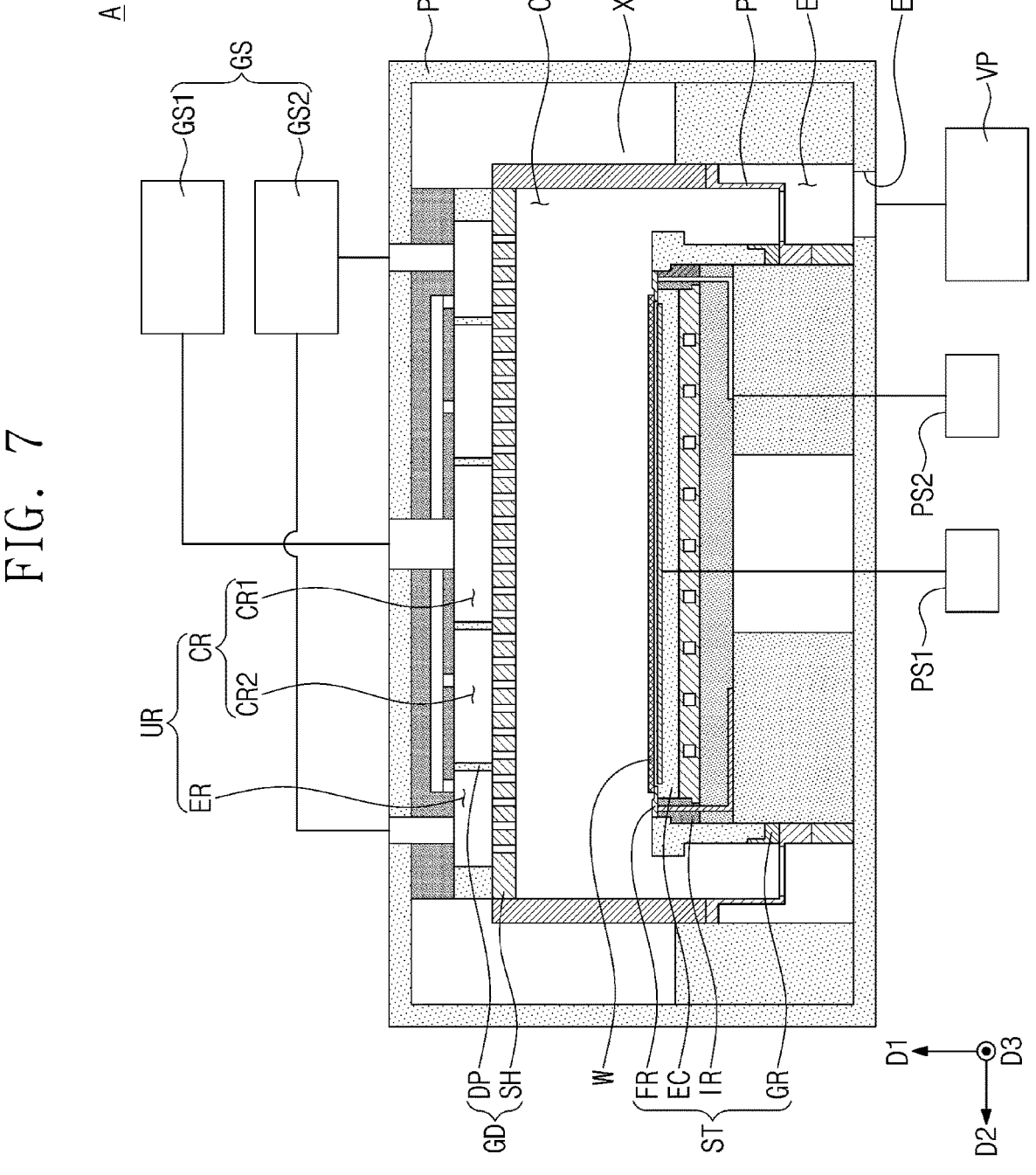
FIGS. 7 to 11 illustrate cross-sectional views showing respective steps of a substrate processing method according to the flow chart of FIG. 6.

Referring to FIGS. 6 and 7, the substrate loading step S1 may include placing a substrate W on the chuck EC. The substrate W may include or may be a silicon (Si) wafer on which conductive patterns, insulator patterns and/or semiconductor patterns may be formed, but the present inventive concepts are not limited thereto. The substrate W may be fixed onto the chuck EC. For example, an electrostatic force provided from the chuck electrode in the chuck EC may compel the substrate W to hold on to a specific position on the chuck EC.

Figure 8:
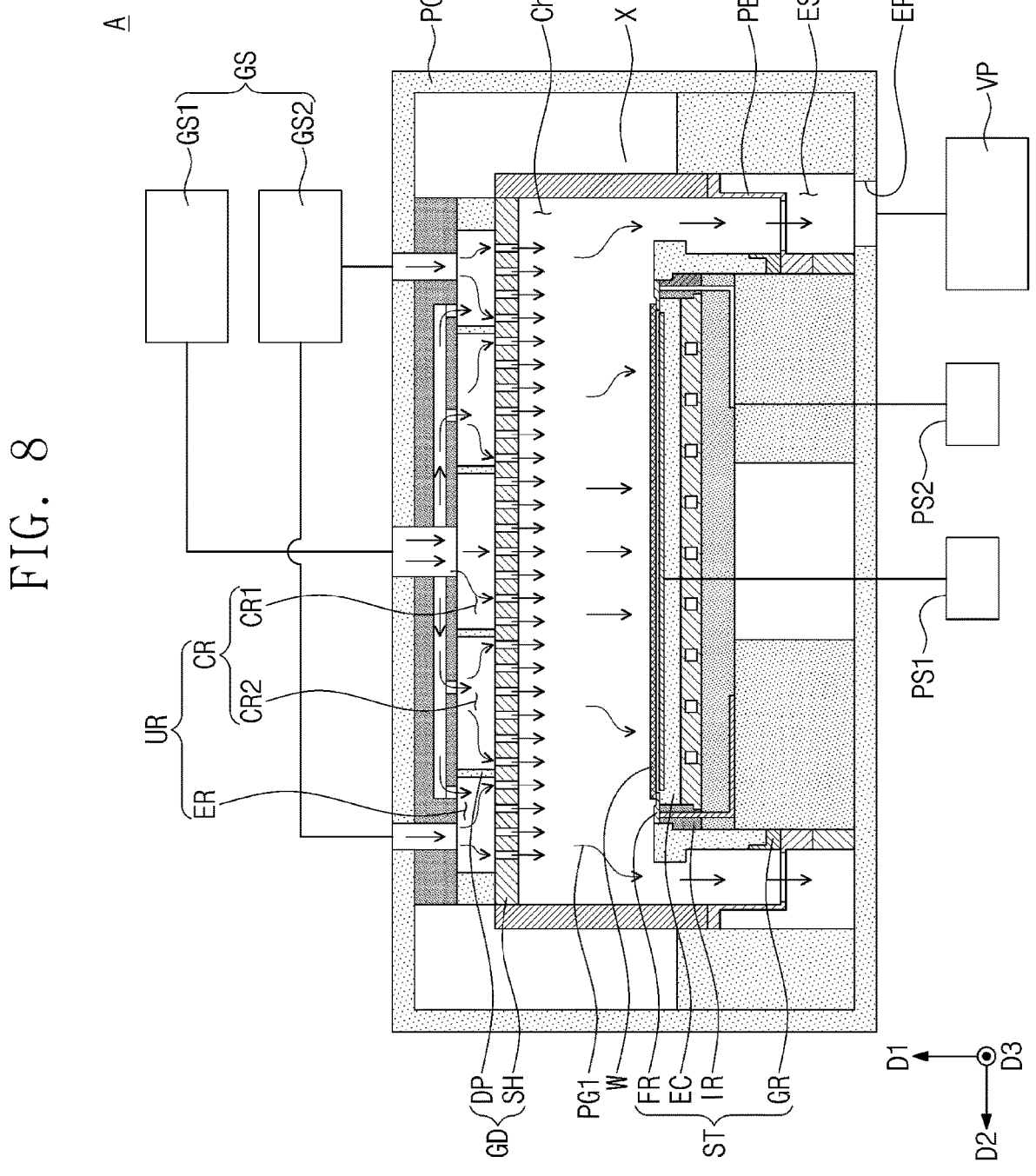

Referring to FIGS. 6 and 8, the gas supply step S2 may include allowing the gas supply unit GS to supply the process space Ch with a process gas PG1. The process gas PG1 supplied from the first gas supply unit GS1 and/or the second gas supply unit GS2 may move onto the substrate W through the distribution space UR and the showerhead SH. A vacuum pressure provided from the vacuum pump VP may drive a portion of the process gas PG1 to move. For example, a portion of the process gas PG1 may move through the plasma baffle PB to the exhaust space ES. The process gas PG1, which moves into the exhaust space ES, may be outwardly discharged through the exhaust port EP from the process chamber PC.

Figure 9:
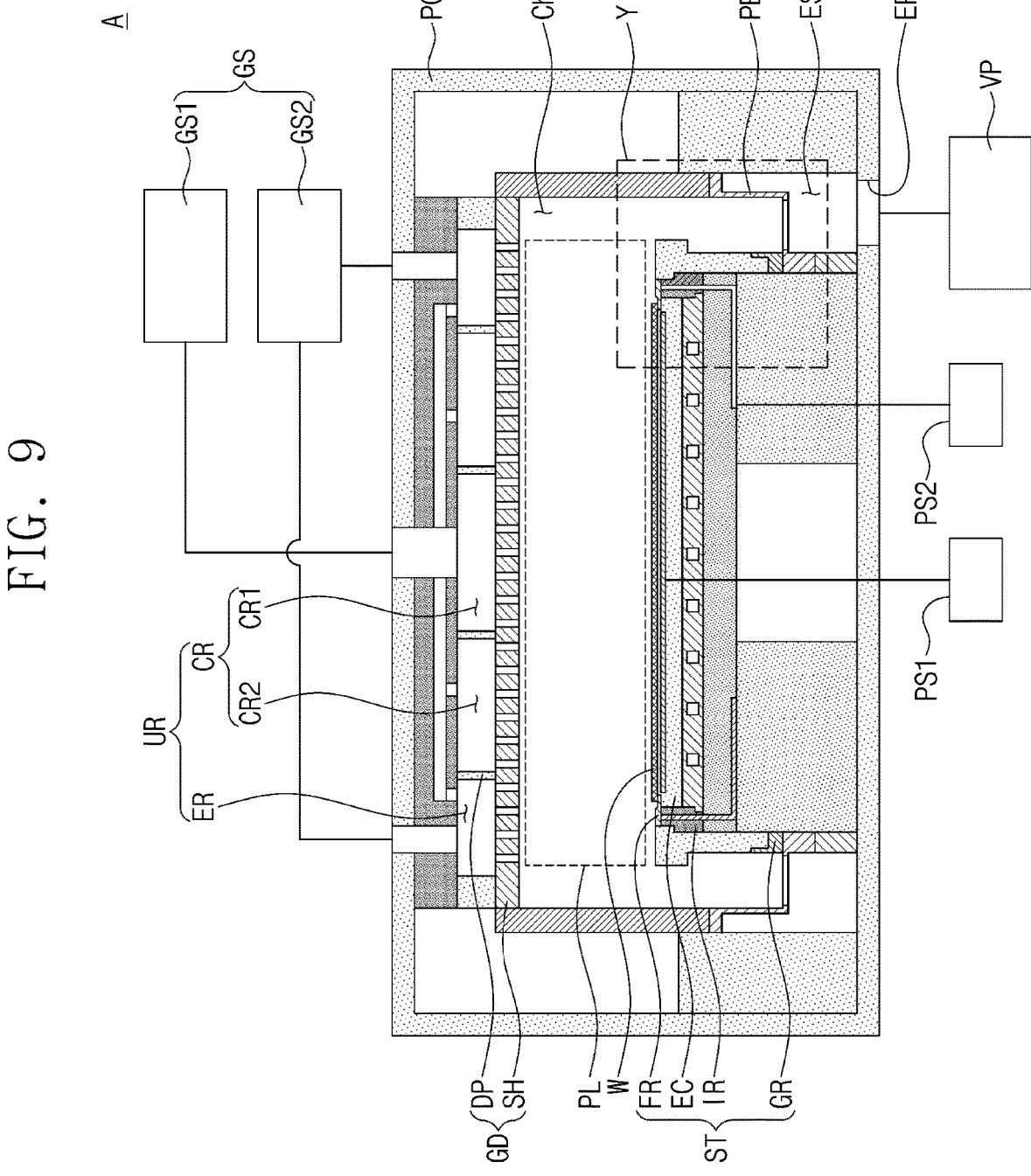
Figure 10:
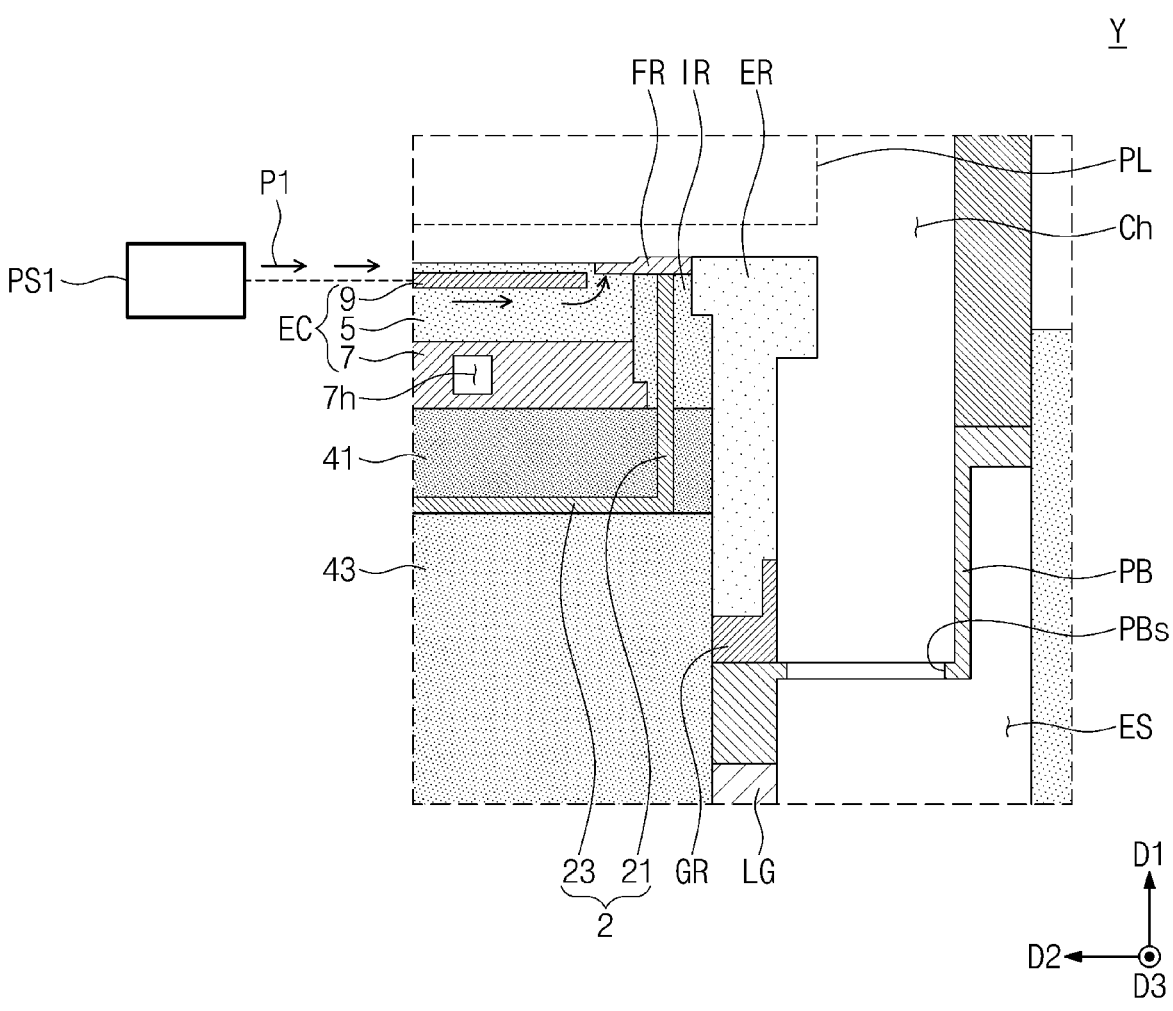

Referring to FIGS. 6, 9, and 10, the first power supply step S3 may include allowing the first power source PS1 to supply the chuck EC with a first power P1. For example, the first power P1 supplied from the first power source PS1 may be applied to the plasma electrode 9. As discussed above, the first power P1 may be a radio-frequency (RF) power.

The RF power applied to the plasma electrode 9 may generate an electric field and/or a magnetic field in the process space Ch. The electric field and/or the magnetic field generated in the process space Ch may convert a portion of the process gas (see PG1 of FIG. 8) into plasma PL. In addition, the electric field and/or the magnetic field generated in the process space Ch may drive a portion of the plasma PL to move toward the substrate W.

The first power supply step S3 may include allowing the focus ring FR to receive a portion of the first power P1 which is applied to the plasma electrode 9. For example, a portion of the first power P1 applied to the plasma electrode 9 may be transferred through the puck 5 to the focus ring FR. A portion of the first power P1 transferred to the focus ring FR may generate an electric field and/or a magnetic field on the focus ring FR and/or in the vicinity of the focus ring FR, e.g., in the process space Ch. Therefore, it may be possible to control the plasma PL on the focus ring FR. For example, the electric field and/or the magnetic field formed by the focus ring FR may control the plasma in the vicinity of the focus ring FR and/or in the process space Ch.

The first power supply step S3 may include allowing the ground ring GR to receive another portion of the first power P1 which is applied to the plasma electrode 9. For example, another portion of the first power P1 applied to the plasma electrode 9 may be transferred to the ground ring GR through one or more of the puck 5, the cooling plate 7, the insulator ring IR, the insulator plate 41, the lower insulator plate 43, and the cover ring ER. Although, another portion of the first power P1 applied to the plasma electrode 9 may move along the first conductive member 21 to the ground ring GR. Another portion of the first power P1 transferred to the ground ring GR may be escaped through the plasma baffle PB and/or the lower ground member LG.

For example, the first power P1 applied to the plasma electrode 9 may be delivered to a component other than the substrate W. An increase in amount of the first power P1 which is escaped through the ground ring GR may induce a reduction in relative amount of the first power P1 which is introduced to the focus ring FR.

A reduction in height of the ground ring GR may induce a decrease in amount of the first power P1 which is escaped through the ground ring GR. For example, when a range of about 52 mm to about 60 mm is given to a difference in level between a top surface of the ground ring GR and a top surface of the chuck EC, an amount of the first power P1 which is escaped through the ground ring GR may be reduced to an appropriate level. In addition, when the top surface of the ground ring GR is located lower than the second conductive member 23, an amount of the first power P1 escaped through the ground ring GR may be reduced to an appropriate level. In this case, there may be an increase in amount of the first power P1 which is transferred to the focus ring FR.

Figure 11:
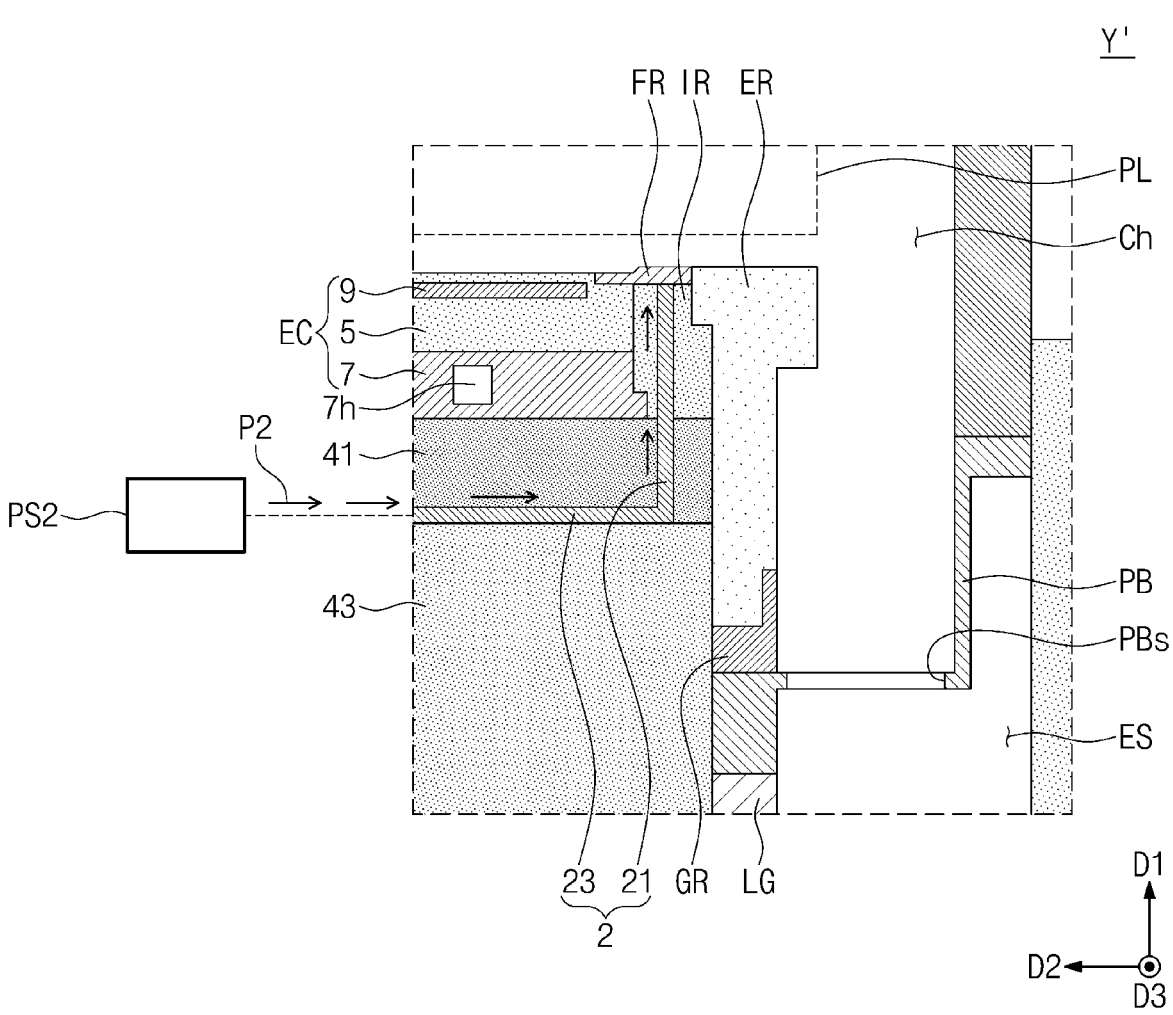

Referring to FIGS. 6, 9, and 11, the second power supply step S4 may include allowing the second power source PS2 to supply the focus ring FR with a second power P2. For example, the second power P2 supplied from the second power source PS2 may be transferred through the power delivery member 2 to the focus ring FR. For example, the second power P2 may move in a horizontal direction along the second conductive member 23, and may then move in a vertical direction along the first conductive member 21, thereby being transferred to the focus ring FR. As discussed above, the second power P2 may be a radio-frequency (RF) power.

A direct-current (DC) power applied to the focus ring FR may control the plasma PL on/over the focus ring FR. The supply of the second power P2 may be carried out when the second power P2 is needed. For example, the second power P2 may be applied to the focus ring FR in certain processes/ embodiments and my not be applied to the focus ring FR in certain other processes/embodiments. For example, when a top surface of the focus ring FR is partially etched as a process is repeatedly performed, the supply of the second power P2 may complement a function of the focus ring FR. For example, the supply of the second power P2 may not be executed when the focus ring FR has a complete shape (or non-damaged shape), and may be executed when the focus ring FR is partially etched/damaged. However, the present inventive concepts are not limited thereto, and the supply of the second power P2 may be fulfilled in other ways in certain embodiments. Therefore, it may be possible to precisely control the plasma PL on an edge region.

When the top surface of the ground ring GR is located at a level higher than that of a bottom surface of the second conductive member 23, a distance between the ground ring GR and the power delivery member 2 may be constant regardless of where the top surface of the ground ring GR is located at a level. For example, the distance between the ground ring GR and the power delivery member 2 may not change when the ground ring GR is moved up or down in certain extent. For example, when the top surface of the ground ring GR is located at a level higher than that of the bottom surface of the second conductive member 23 and the horizontal distance between the power delivery member 2 and the ground ring GR remains the same, a distance between the ground ring GR and the power delivery member 2 may be a horizontal distance between the ground ring GR and the first conductive member 21 because the ground ring GR and the first conductive member 21 overlap laterally and side surfaces facing each other are parallel. In this case, it may be hard to control an amount of the first power P1 and/or the second power P2 that are escaped through the ground ring GR.

According to the present inventive concepts, when the top surface of the ground ring GR is located lower than the bottom surface of the second conductive member 23, it may be possible to adjust a minimum distance between the ground ring GR and the power delivery member 2. In this case, the distance between the ground ring GR and the power delivery member 2 may depend on the vertical level of the power delivery member 2. When the top surface of the ground ring GR is located lower than the second conductive member 23, an amount of the second power P2 escaped through the ground ring GR may be reduced to an appropriate level. For example, a distance between the top surface of the ground ring GR and the second conductive member 23 or another component (e.g., the top surface of the chuck EC) may be set for the second power P2 escaping/leaking through the ground ring GR to be the appropriate level. Therefore, there may be an increase in amount of the second power P2 which transferred to the focus ring FR. For example, when the top surface of the ground ring GR is adjusted to be located at a level suitably lower than that of the bottom surface of the second conductive member 23, an amount of the second power P2 transferred to the focus ring FR may be controlled to an appropriate level.

It is explained that the first power supply step S3 is performed followed by the second power supply step S4, but the present inventive concepts, however, are not limited thereto. For example, the steps S3 and S4 may be executed at the same time. For another example, the steps S3 and S4 may be executed alternately and repeatedly. For example, the step S4 may be performed prior to perform the step S3 in certain embodiments and/or in certain steps.

According to a substrate processing apparatus and a substrate processing method using the same in accordance with some embodiments of the present inventive concepts, a ground ring and a chuck may be designed to have their top surfaces that are appropriately spaced apart from each other, and thus it may be possible to reduce an amount of radio-frequency (RF) power which is escaped through the ground ring. Therefore, plasma on a focus ring may be controlled by increasing an amount of RF power which is transferred to the focus ring. For example, there may be an increase in ion energy of the plasma positioned on an edge region of the focus ring. Therefore, it may be possible to increase an etching yield with respect to a substrate edge region. For example, etching and/or deposition uniformity may be increased in an etching process and/or in a deposition process performed on a substrate in the substrate processing apparatus.

According to a substrate processing apparatus and a substrate processing method using the same in accordance with some embodiments of the present inventive concepts, the ground ring may be located lower than a power delivery member. In this case, it may be possible/beneficial to control an amount of RF power and/or DC power that are transmitted along the power delivery member and escaped through the ground ring. Accordingly, a precise control may be executed on the plasma on/over the edge region of the focus ring.

According to a substrate processing apparatus and a substrate processing method of the present inventive concepts, control of plasma on an edge region of a substrate/stage/chuck may be improved.

According to a substrate processing apparatus and a substrate processing method of the present inventive concepts, it may be possible to reduce leakage of RF power applied to a chuck.

According to a substrate processing apparatus and method of the present inventive concepts, it may be possible to reduce leakage of DC power applied to a focus ring.

Effects of the present inventive concepts are not limited to the ones mentioned above, other effects which have not been mentioned above will be clearly understood to those skilled in the art from the description.

Although the present inventive concepts have been described in connection with the embodiments of the present inventive concepts illustrated in the accompanying drawings, it will be understood to those skilled in the art that various changes and modifications may be made without departing from the technical spirit and essential features of the present inventive concepts. It therefore will be understood that the embodiments described above are just illustrative but not limitative in all aspects.

What is claimed is:

1. A substrate processing apparatus, comprising:
a chuck configured to support a substrate;
an insulator ring that surrounds the chuck;
a focus ring on the insulator ring; and
a ground ring outside the insulator ring,
wherein the ground ring includes:
a ground ring body; and
an extension ring on the ground ring body,
wherein a width of the extension ring in a horizontal and radial direction is less than a width of the ground ring body in the horizontal and radial direction,
wherein an inner lateral surface of the extension ring is positioned farther than an inner lateral surface of the ground ring body from a center point of the ground ring, and
wherein a top surface of the extension ring is positioned lower than a top surface of the chuck by a vertical distance in a range of about 52 mm to about 60 mm.

2. The substrate processing apparatus of claim 1, wherein the inner lateral surface of the ground ring body is positioned farther than an outer lateral surface of the chuck from a center of the chuck in a plan view.

3. The substrate processing apparatus of claim 1, wherein an angle between a line connecting closest points between a top surface of the chuck and a top surface of the extension ring and a vertical line passing through one of the closest points is equal to or less than about 40°.

4. The substrate processing apparatus of claim 1, further comprising a cover ring that surrounds the focus ring and the insulator ring,
wherein a bottom surface of the cover ring is in contact with a top surface of the ground ring body.

5. The substrate processing apparatus of claim 1, wherein the chuck includes:
a puck;
a plasma electrode in the puck; and
a cooling plate below the puck,
wherein the top surface of the extension ring is lower than a bottom surface of the cooling plate.

6. The substrate processing apparatus of claim 5, further comprising a power delivery conductor line below the focus ring,
wherein the power delivery conductor line includes:
a first conductive line that vertically extends in the insulator ring; and
a second conductive line electrically connected to a bottom end of the first conductive line, the second conductive line inwardly extending in a horizontal direction from the bottom end of the first conductive line,
wherein a level of the top surface of the extension ring is lower than a level of a bottom surface of the second conductive line.

7. The substrate processing apparatus of claim 6, further comprising:
a first power source configured to apply a first power to the plasma electrode; and
a second power source configured to apply a second power to the power delivery conductor line.

8. The substrate processing apparatus of claim 6, further comprising an insulator plate below the chuck, wherein the second conductive line is in the insulator plate.

9. The substrate processing apparatus of claim 1, wherein a height of the ground ring is in a range of about 29 mm to about 33 mm.

10. A substrate processing apparatus, comprising:
a chuck that has a plasma electrode;
an insulator ring that surrounds the chuck;
a focus ring on the insulator ring;
a cover ring that surrounds the focus ring;
a ground ring outside the insulator ring;
a power delivery conductor line below the focus ring;
a first power source configured to apply a first power to the plasma electrode; and
a second power source configured to apply a second power to the power delivery conductor line,
wherein the power delivery conductor line includes:
a first conductive line that vertically extends through the insulator ring between the chuck and the cover ring; and
a second conductive line connected to a bottom end of the first conductive line, the second conductive line inwardly extending in a horizontal direction from the bottom end of the first conductive line,
wherein the ground ring includes:
a ground ring body; and
an extension ring on the ground ring body,
wherein a width of the extension ring is less than a width of the ground ring body, wherein an inner lateral surface of the extension ring is more outwardly than an inner lateral surface of the ground ring body,
wherein the cover ring extends for a vertical distance greater than a vertical distance of the first conductive line,
wherein a level of a top surface of the ground ring is lower than a level of a bottom surface of the second conductive line, and
wherein the bottom surface of the cover ring is in contact with a top surface of the ground ring body.

11. The substrate processing apparatus of claim 10, further comprising an insulator plate below the chuck,
wherein the second conductive line extends in a horizontal direction in the insulator plate.

12. The substrate processing apparatus of claim 10, wherein the first conductive line is electrically connected to the focus ring.

13. The substrate processing apparatus of claim 10, wherein a height of the ground ring is about 48 mm or less.

14. The substrate processing apparatus of claim 10, wherein an angle between a minimum line and a vertical line is equal to or less than about 40°, the minimum line being a line connecting a top surface of the extension ring and a top surface of the chuck.

15. The substrate processing apparatus of claim 10, wherein a height of a top of the extension ring is lower than a top surface of the chuck by a vertical distance in a range of about 52 mm to about 60 mm.

*   *   *   *   *